United States Patent [19]
Sakuragawa et al.

[11] Patent Number: 5,907,265
[45] Date of Patent: May 25, 1999

[54] HIGH-FREQUENCY CIRCUIT BOARD TRACE CROSSING AND ELECTRONIC COMPONENT THEREFOR

[75] Inventors: Toru Sakuragawa, Osaka; Naoki Yuda, Hirakata; Kimio Aizawa, Ikoma; Ikuo Ota, Hirakata; Hideki Nanba, Yamatokoriyama, all of Japan

[73] Assignee: Matsushita Electric Industrial Co., Ltd., Japan

[21] Appl. No.: 08/927,517

[22] Filed: Sep. 11, 1997

[30]    Foreign Application Priority Data

Sep. 13, 1996  [JP]  Japan ................................ 8-242761

[51] Int. Cl.⁶ ............................................. H01P 5/12
[52] U.S. Cl. ................................ 333/1; 333/246; 361/778
[58] Field of Search ............................... 333/1, 246, 247, 333/260; 361/773, 778; 257/664, 728

[56]              References Cited

U.S. PATENT DOCUMENTS

| | | | |
|---|---|---|---|
| 3,821,611 | 6/1974 | Bacher | 361/778 |
| 4,000,054 | 12/1976 | Marcantonio | 361/778 X |
| 4,283,485 | 8/1981 | Müenz et al. | 361/778 X |
| 5,117,207 | 5/1992 | Powell et al. | 333/1 |
| 5,532,658 | 7/1996 | Tonegawa et al. | 333/246 |

*Primary Examiner*—Paul Gensler
*Attorney, Agent, or Firm*—Parkhurst & Wendel, L.L.P.

[57]              ABSTRACT

An inexpensive high-frequency circuit device and its electronic component which allows two traces or lines to cross on the same surface without affecting other circuits characteristics. At least one of the lines is a high-frequency signal line. The high-frequency circuit device includes an insulated circuit board having a main surface, a first line disposed on the main surface of the circuit board, a second line disposed on the main surface of the circuit board crossing the first line with an electrically unconnected section at an intersection area of the two lines, a grounding terminal disposed on the main surface of the circuit board, a chip-type electronic component mounted on the main surface of the circuit board which has an insulating body and a line disposed on the insulating body for electrically bridging the electrically unconnected section in the second line, and a grounding layer disposed between the line on the electronic component and the first line which is electrically connected to the grounding terminal. The electronic component mounted on the above circuit board electrically bridges the unconnected section in the second line.

19 Claims, 8 Drawing Sheets

5,907,265

HIGH-FREQUENCY CIRCUIT BOARD TRACE CROSSING AND ELECTRONIC COMPONENT THEREFOR

FIELD OF THE INVENTION

The present invention relates to the field of high-frequency circuit devices and their associated electronic components used for a range of products such as mobile communications equipment, and more particularly to those devices which allow the crossing of lines on the surface of circuit boards without creating multiple layers and also enables the suppression of undesirable electrical coupling between crossing lines.

BACKGROUND OF THE INVENTION

FIG. 7 is an example of a high-frequency circuit device of the prior art which employs a multiple-layer board 11 comprising a wiring layer 11a on the top face, a grounding layer 11d on the bottom face, a grounding layer 11b provided on an insulating material inside the multiple-layer board 11, and a wiring layer 11c provided on an insulating material between the grounding layers 11b and 11d. A line 12, or trace, is disposed on the surface of the multiple-layer board 11, and a line 13 crosses line 12 on the same surface as line 12. Line 13 has an unconnected section 13x (indicated with the broken line) which is not electrically connected at the crossing area. A line 14 is disposed on wiring layer 11c at an area which crosses underneath line 12. Both ends of line 13 facing the unconnected section 13x are electrically connected with line 14 respectively using through-holes 15a and 15b. A high-frequency circuit device of the prior art as explained above may require the entire board to be designed in multiple layers the crossing area being just a part of the overall wiring on the board.

In the above structure, one disadvantage is that a multiple layer board may be required if even only one crossing of signal lines exists in the circuit, resulting in higher component cost.

Another disadvantage is that the characteristic impedance of signal lines on the wiring layers 11a and 11c becomes smaller compared to that of a board with the same thickness which does not have multiple layers because of the presence of the grounding layers 11b and 11d. To obtain the equivalent characteristic impedance of signal lines to that of a board which does not have multiple layers, lines may need to be made thinner, resulting in increased resistance of lines, thereby causing deterioration in characteristics due to transmission loss.

Simple jumper chips have already been implemented for crossing lines on a board. However, jumper chips may cause electrical coupling between lines, resulting in deterioration of performance.

SUMMARY OF THE INVENTION

The present invention offers a high-frequency circuit device and an electronic component which allows crossing of lines disposed on a board surface without using multiple-layer boards and enables the suppression of undesirable electrical coupling through stray capacitance between the crossing lines.

The high-frequency circuit device of the present invention comprises an insulated circuit board having a main surface, a first line disposed on the main surface of the circuit board, a second line having an unconnected section which is not electrically connected over the crossing area and disposed on the main surface of the circuit board crossing the first line, a grounding terminal disposed on the main surface of the circuit board, a chip-type electronic component mounted on the main surface of the circuit board comprising an insulating body and a line disposed on the insulating body which electrically bridges the unconnected section in the second line, and a grounding layer disposed between the line on the electronic component and the first line, the grounding layer being electrically connected to the grounding terminal. At least one of the first and second lines is the high-frequency signal line.

The electronic component of the present invention is mounted on the above circuit board, and it is used for electrically bridging the unconnected section of the second line. The electronic component comprises an insulating body, a first conductive layer provided on the insulating body for electrically bridging the unconnected section of the second line, a second conductive layer provided in the insulating body between the first conductive layer and the first line, a pair of first terminals disposed on the sides of the insulating body for electrically connecting the first conductive layer and the second line, and a second terminal disposed on the side of the insulating body for electrically connecting the second conductive layer and the grounding terminal.

DESCRIPTION OF THE PREFERRED EMBODIMENTS

First exemplary embodiment

Figure 1:
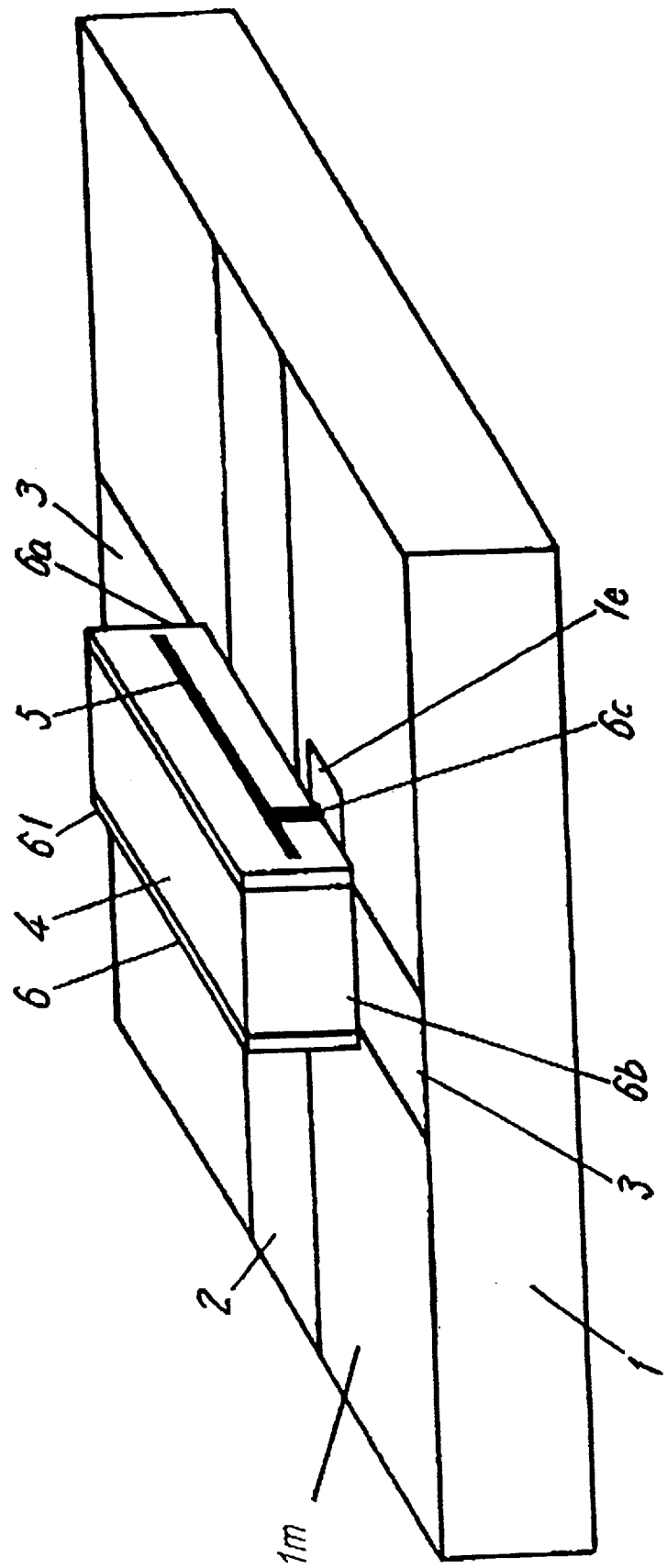
FIG. 1 is a perspective view of a high-frequency circuit device in accordance with a first exemplary embodiment of the present invention.
Figure 2A:
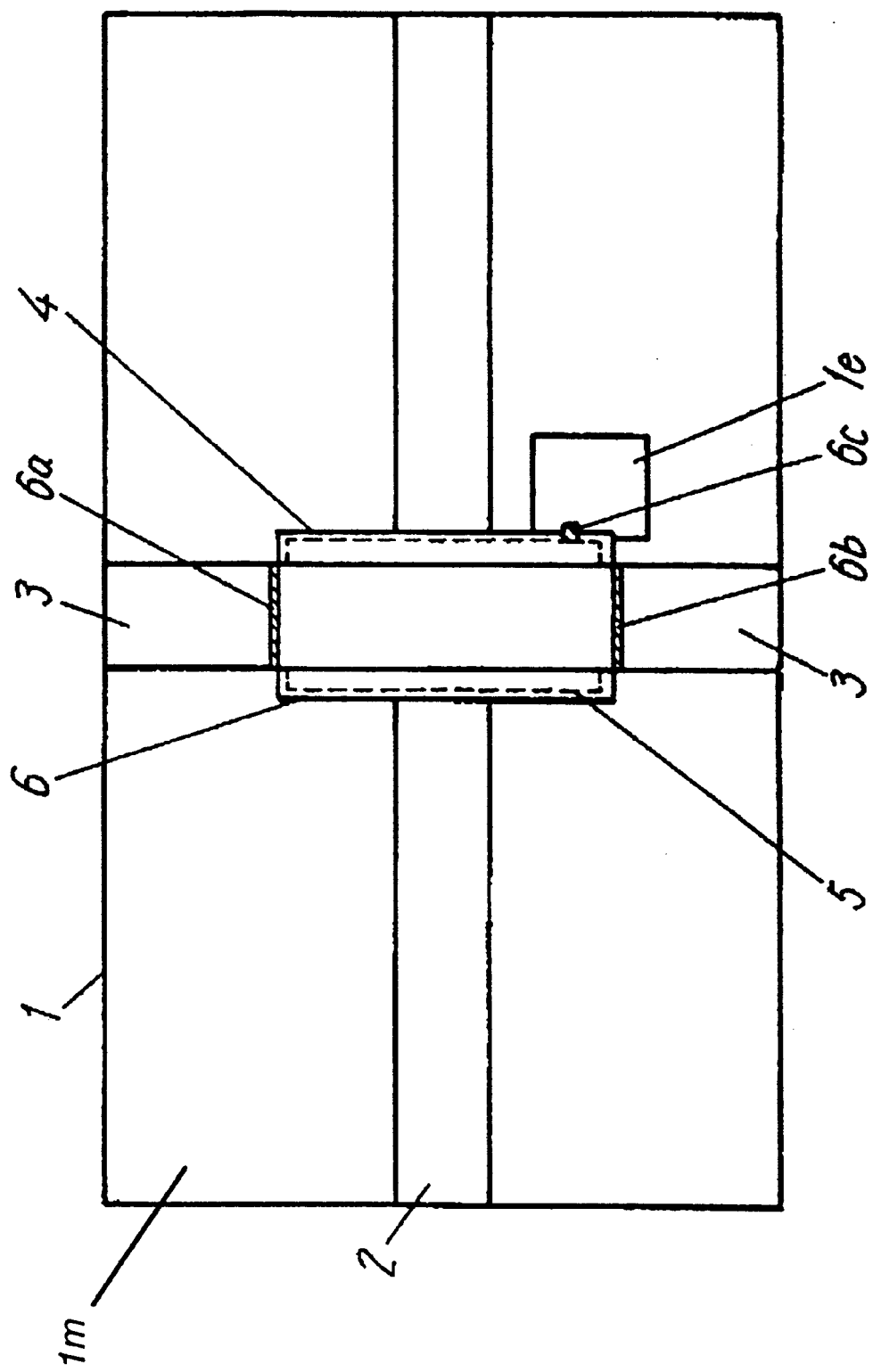
FIG. 2A is a top view of a high-frequency circuit device in accordance with the first exemplary embodiment of the present invention.
Figure 2B:
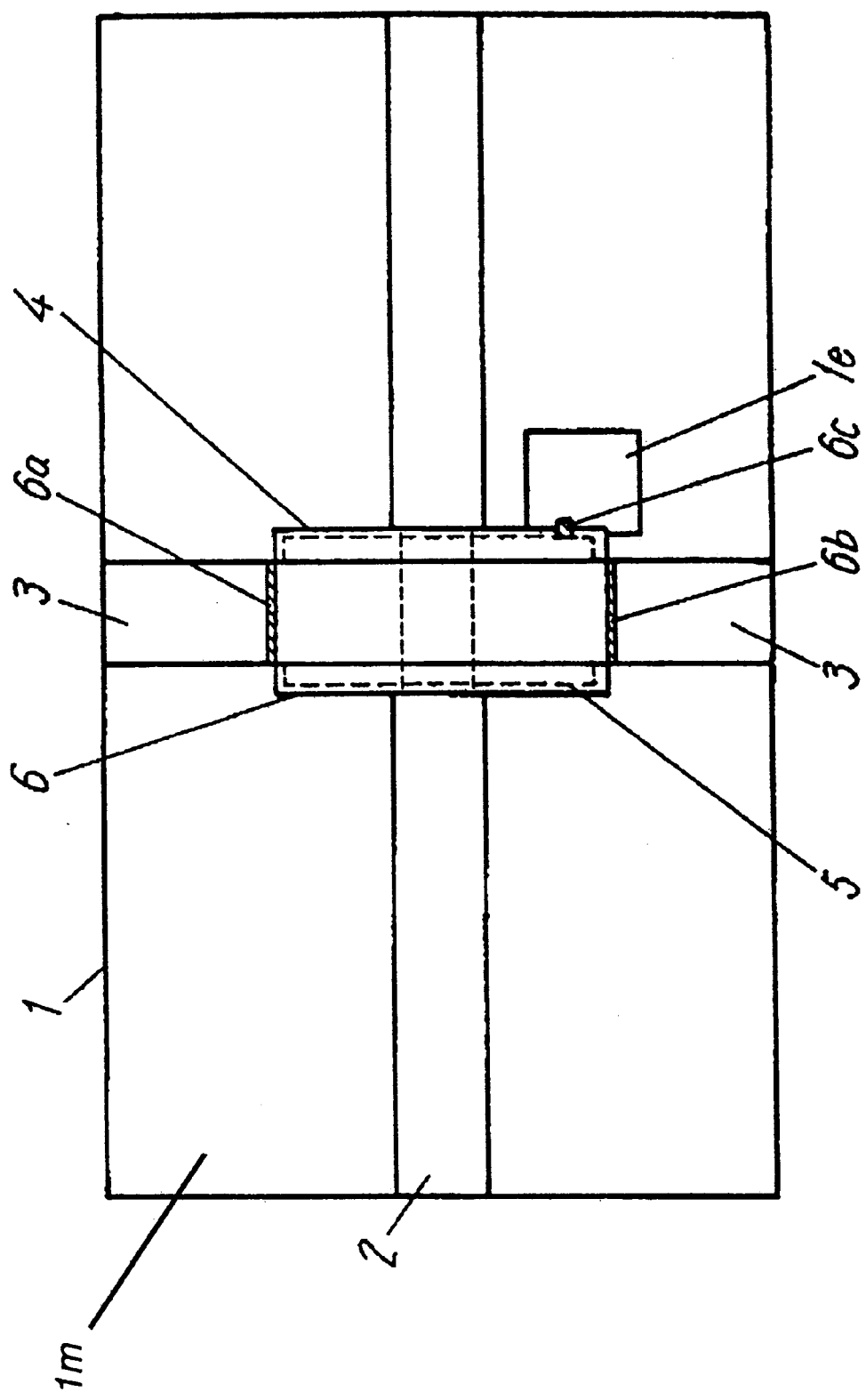
FIG. 2B is a top view of a high-frequency circuit device in accordance with the first exemplary embodiment of the present invention showing a narrowing line in the area directly under the electronic component.

FIGS. 1, 2A and 2B show a high-frequency circuit device according to a first exemplary embodiment of the present invention. A line (also commonly known as a trace) 2 consisting of a conductive layer, a line 3 consisting of a conductive layer which crosses line 2, and a grounding terminal 1e consisting of a conductive layer are disposed on a main surface 1m of an electrically-insulated circuit board 1. Line 3 has a section (not illustrated) which is not electrically connected across a crossing portion of line 2. At least one of the lines 2 and 3 is the high-frequency signal line.

A chip-type electronic component 6 is mounted over the unconnected section of line 3 on the main surface 1m of the circuit board 1. The electronic component 6 comprises an insulating body 61 and the following parts. A line 4 is disposed on the surface of the long side of the insulating body 61 and consists of a first conductive layer, which is preferably almost the same width as line 3, for electrically bridging the unconnected section of line 3.

A pair of connection terminals 6a and 6b are disposed on the side face of the short sides of the insulating body 61 and consist of a conductive layer which is electrically connected to both ends of line 4. A grounding layer 5 consists of a second conductive layer provided inside the insulating body 61. A connection terminal 6c is disposed on the side face of the long side of the insulating body 61 and consists of a conductive layer which is electrically connected with the grounding layer 5. An electrically connected line composed of conductive layers 3, 6a, 4, 6b, and 3 is formed by surface mounting the above electronic component 6 on the main surface 1m of the circuit board 1 and soldering the connection terminals 6a and 6b to the ends of the line 3 facing the unconnected section 3x. . The conductive layers 5, 6c, and 1e are electrically connected by soldering the connection terminal 6c to the grounding terminal 1e. Consequently, the first conductive layer of the electronic component 6 forms line 4, and the second conductive layer forms the grounding layer 5 disposed between line 4 and first line 2.

The above structure allows the lines on the surface of the circuit board 1 to be crossed at low cost without using a multiple-layer board, by applying the circuit device of the present invention to the crossing part. Electrical coupling between crossing lines can also be suppressed by keeping the second conductive layer at the grounding potential level. This enables wiring without affecting the characteristic impedance of other lines on the circuit board 1. The same effect is obtainable when lines 2 and 3 cross in the multiple numbers.

Multiple connection terminals 6c may also be provided for stabilizing the grounding layer 5, or multiple second conductive layers may be provided as multiple grounding layers 5 in an inner layer of the electronic component 6.

Figure 3:
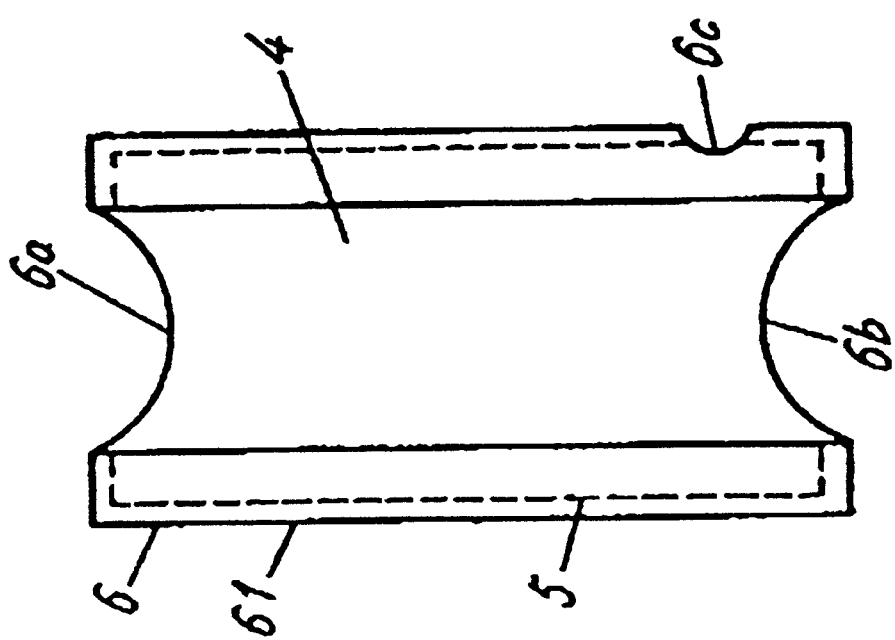
FIG. 3 is a top view of another example of an electronic component used for a high-frequency circuit device in accordance with the first exemplary embodiment of the present invention.

Moreover, connection terminals 6a, 6b, and 6c can be created, as shown in FIG. 3, on a semi-circular concave portion on the sides of the insulating body 61. This can be easily made by first creating a through-hole on the side of the electronic component 6 and cutting half of the through-hole.

In this exemplary embodiment, line 4 is disposed on the surface and the conductive layer which acts as the grounding layer 5 is disposed on an inner layer of the electronic component 6. However, it is apparent that an electronic component having a conductive layer which becomes a line can be placed over an electronic component having a conductive layer which becomes a grounding layer on its surface by providing an insulating layer in between. Line 4 and a conductive layer which becomes the grounding layer 5 can also be disposed on separate inner layers of the electronic component 6 as a shield from the influence of external high-frequency signals.

Since one area of line 2 directly under the electronic component 6 is affected by the grounding layer 5, the characteristic impedance of line 2 at that area is smaller than in areas other than the area directly under the electronic component 6. The characteristic impedance of the area directly under the electronic component 6 can be made equivalent to that of the line 2 other than the area directly under the electronic component 6 by narrowing line 2 in the area directly under the electronic component 6 as shown in FIG. 2B. Any transmission loss of the signal carried by line 2 can be suppressed by reducing the loss caused by the difference in the characteristic impedance.

Second exemplary embodiment

Figure 4:
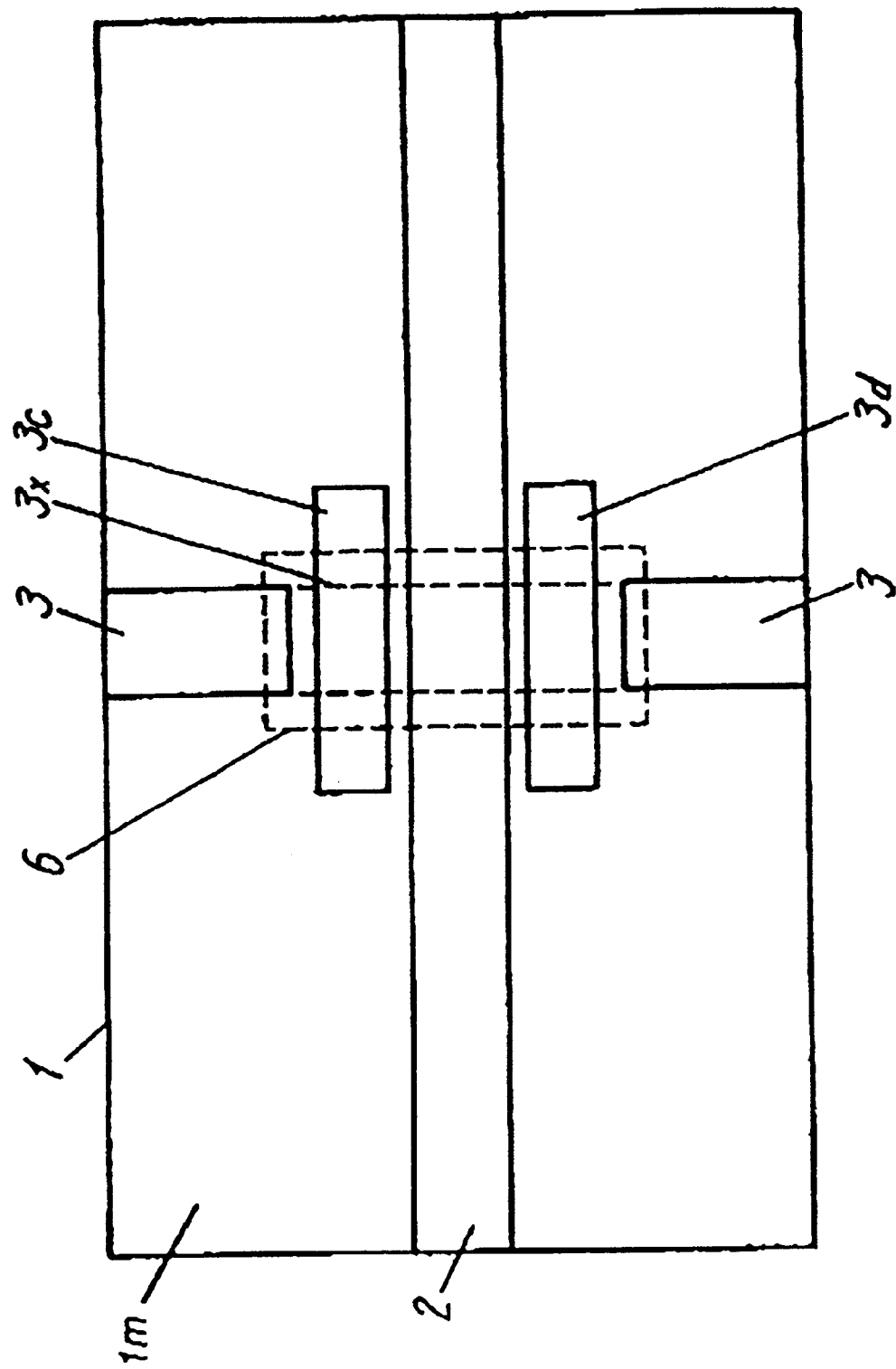
FIG. 4 is a top view of a high-frequency circuit device in accordance with a second exemplary embodiment of the present invention.

FIG. 4 shows a high-frequency circuit device according to a second exemplary embodiment of the present invention. A line 2 consisting of a conductive layer, a line 3 consisting of a conductive layer which crosses line 2, and grounding terminals 3c and 3d consisting of conductive layers are disposed on a main surface 1m of an electrically-insulated circuit board 1. Line 3 has an unconnected section 3x (illustrated with the broken line) which is not electrically connected over the section that crosses line 2. The grounding terminals 3c and 3d are placed over the unconnected section 3x in line 3 at an area which does not electrically connect with lines 2 and 3. At least one of the lines 2 and 3 is the high-frequency signal line.

Figure 5:
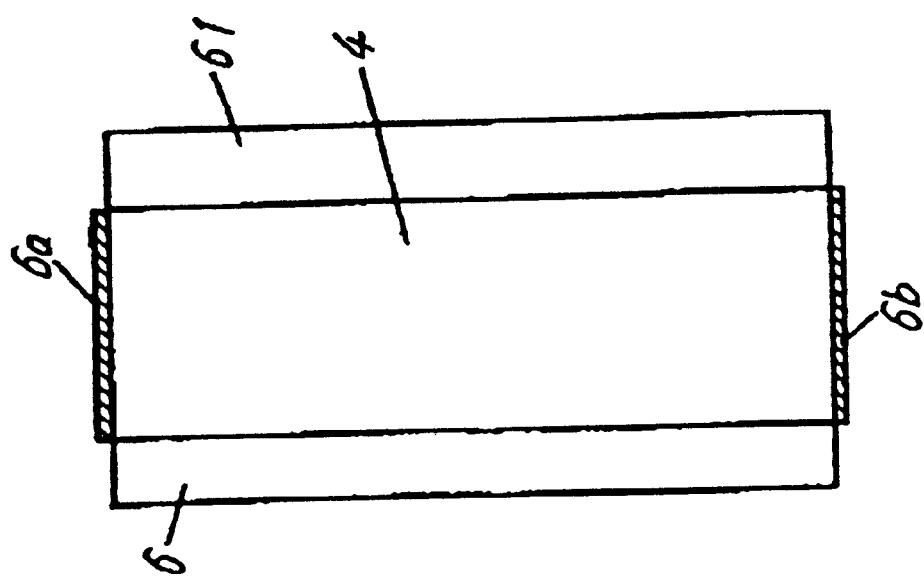
FIG. 5 is a top view of an electronic component used for a high-frequency circuit device in accordance with the second exemplary embodiment of the present invention.

A chip-type electronic component 6 is mounted over the unconnected section 3x of line 3 on the main surface 1m of the circuit board 1. The electronic component 6 comprises, as shown in FIG. 5, an insulating body 61, a line 4 consisting of a conductive layer disposed on the insulating body 61 for electrically bridging the unconnected section 3x of line 3, and connection terminals 6a and 6b consisting of a conductive layer disposed on the sides of the insulating body 61 which are electrically connected to both ends of line 4. An electrically connected line composed of conductive layers 3, 6a, 4, 6b, and 3 is formed by surface mounting the electronic component 6 on the main surface 1m of the circuit board 1 and electrically connecting, by soldering, the connection terminals 6a and 6b to both ends of the line 3 facing the unconnected section 3x.

With the above structure, electrical coupling between lines 2 and 3 can be suppressed by the provision of the grounding terminals 3c and 3d on the main surface 1m of the circuit board 1 between lines 2 and 3.

In this exemplary embodiment, a grounding layer may not be required between the lines 2 and 4, which allows the use of conventional jumper chips as the chip-type electronic component 6 as shown in FIG. 5. To prevent electrical coupling between lines 2 and 3, it is desirable to use a jumper chip which secures a larger distance between lines 2 and 4.

The shapes of the grounding terminals 3c and 3d are not limited to rectangles. They may be formed to surround line 3 respectively. One of the ground terminals 3c or 3d may also be omitted if the electrical coupling between lines 2 and 3 is small.

If the electronic component 6 used in a high-frequency circuit device of the first exemplary embodiment is employed instead of a jumper chip, the second conductive layer of the electronic component 6 can be connected to the grounding layers 3c and 3d by electrically connecting, by soldering, the connection terminals 6a and 6b to the ends of line 3 facing the unconnected section 3x and the connection terminal 6c to the grounding terminals 3c and 3d. This provides the grounding layer 5 between lines 2 and 4. Thus, the use of the electronic component 6 realizes a circuit device with yet smaller electrical coupling.

Third exemplary embodiment

Figure 6:
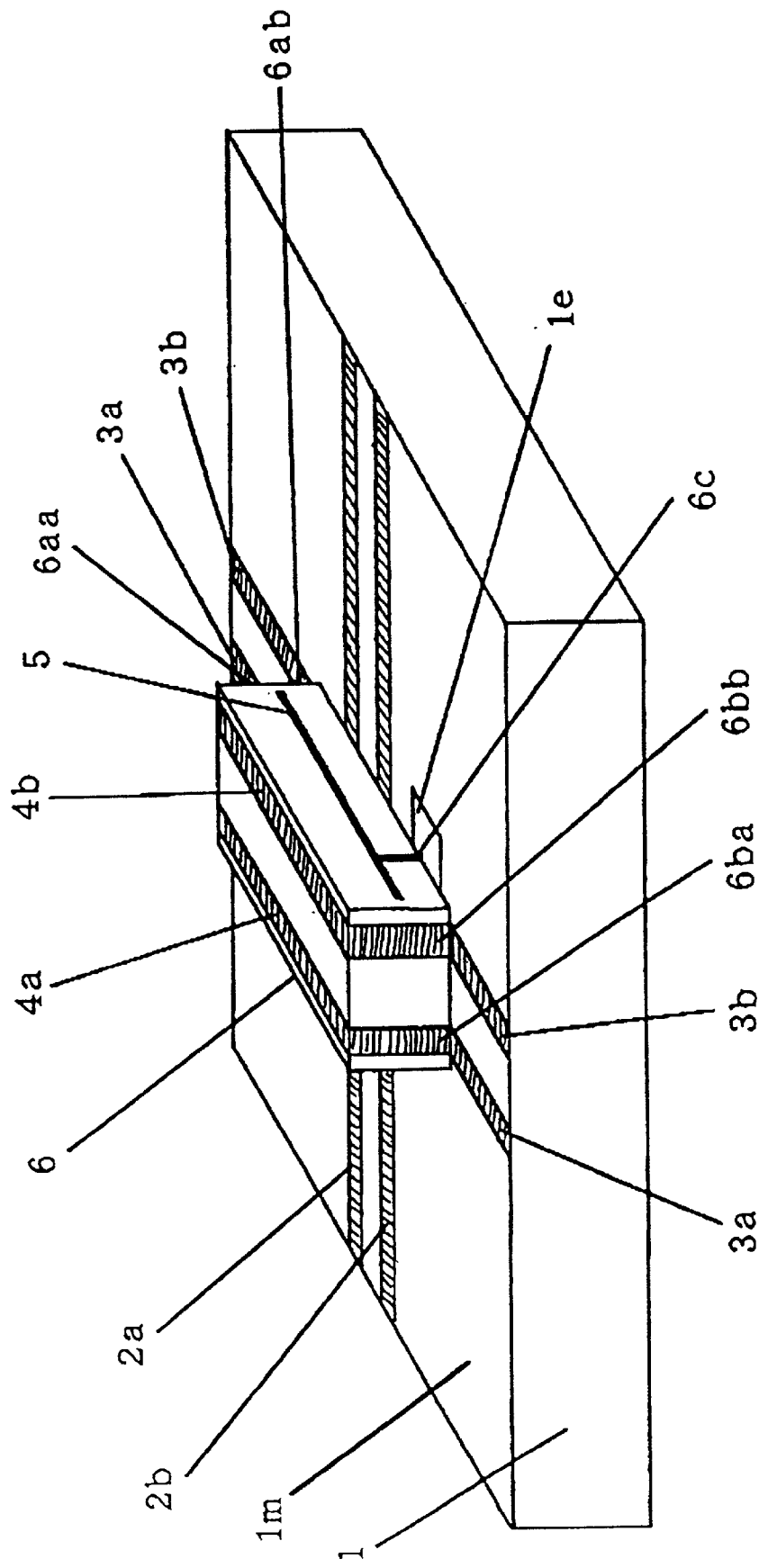
FIG. 6 is a perspective view of a high-frequency circuit device in accordance with a third exemplary embodiment of the present invention.
Figure 7:
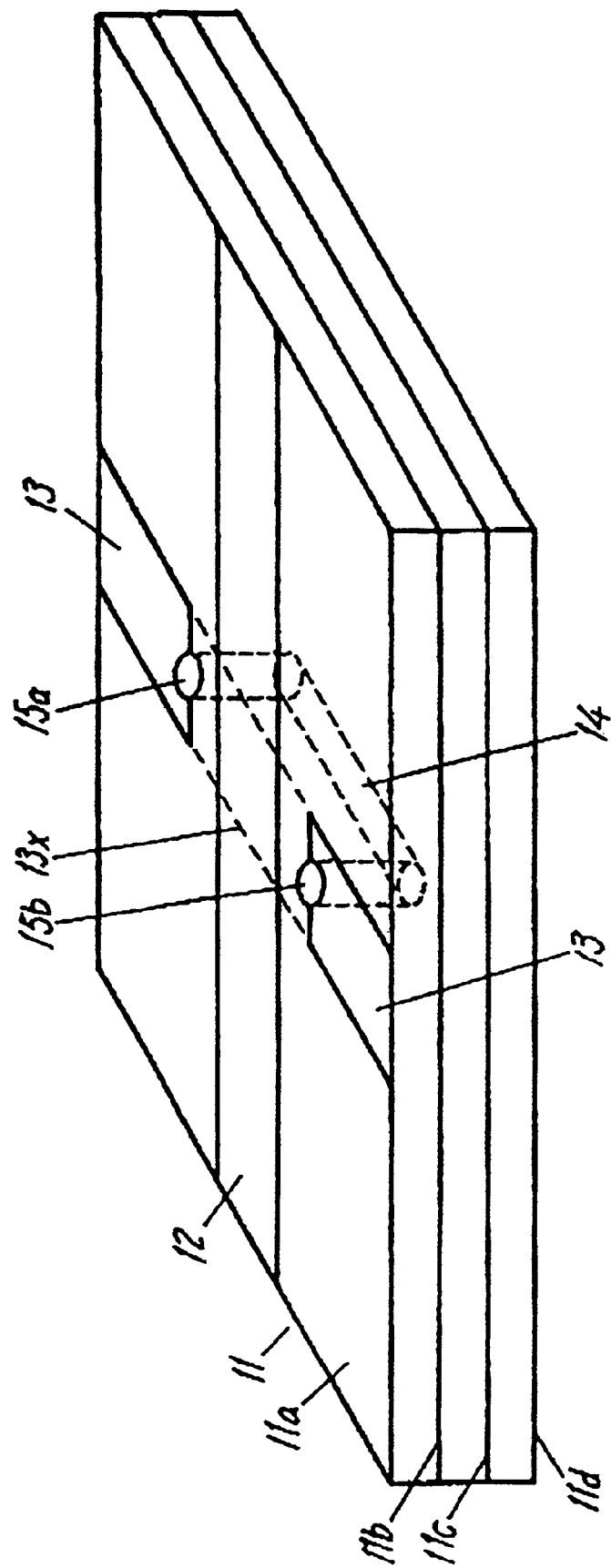
FIG. 7 is a perspective view of a high-frequency circuit device of the prior art.

FIG. 6 shows a high-frequency circuit device according to a third exemplary embodiment of the present invention. This is an example of a structure formed by two lines each instead of lines 2, 3, and 4 in the first exemplary embodiment. That is, lines 2a and 2b, lines 3a and 3b, and lines 4a and 4b are provided, as shown in FIG. 6. Components which are the same as the first exemplary embodiment are given the same numerals, and thus their explanation is omitted here.

Lines 3a and 3b, and lines 4a and 4b can be electrically connected easily by providing connection terminals 6aa and 6ab and connection terminals 6ba and 6bb on the electronic component 6 for connecting two lines 4a and 4b to lines 3a and 3b. In addition, electrical coupling between the multiple crossing lines can be suppressed. The same effect is easily obtainable, using the same structure, but with an even increased number of lines.

The same effect is also obtainable when lines 2, 3, and 4 in the second exemplary embodiment are formed by two lines each in the same way as this exemplary embodiment.

From the above explanation, it is apparent that the present invention allows lines disposed on the surface of the same board to cross without creating multiple layers in a circuit board, and also offers an inexpensive high-frequency circuit device and an electronic component used therein which have less influence on other circuits on the same board.

A high-frequency circuit device and its electronic component of the present invention can be realized in still other ways. For instance, multiple terminals for connecting with the grounding layer or multiple grounding layers can be provided. A line on the electronic component need not necessarily be disposed on the surface thereof.

The preferred embodiments described herein are therefore illustrative and not restrictive, the scope of the invention being indicated by the appended claims and all variations which come within the meaning of the claims are intended to be embraced therein.

What is claimed is:

1. A high-frequency circuit device, comprising:
   (a) an insulated circuit board having a main surface;
   (b) a first line disposed on the main surface of said circuit board;
   (c) a second line disposed on the main surface of said circuit board, said second line crossing said first line at an intersecting area and having an electrically unconnected section at said intersection area;
   (d) a grounding terminal disposed on the main surface of said circuit board;
   (e) a chip-type electronic component mounted on the main surface of said circuit board, said electronic component comprising:
      (i) an insulating body and
      (ii) a line disposed on said insulating body, said line electrically bridging the electrically unconnected section of said second line; and
   (f) a grounding layer disposed between said line on said electronic component and said first line, said grounding layer being electrically connected to said grounding terminal.

2. A high-frequency circuit device as defined in claim 1, wherein said first line narrows in width at said intersection area, whereby the characteristic impedance of said first line at said intersection area is substantially equivalent to the characteristic impedance of said first line at all other areas of said first line other than said intersection area.

3. A high-frequency circuit device, comprising:
   (a) an insulated circuit board having a main surface;
   (b) a first line disposed on the main surface of said circuit board;
   (c) a second line disposed on the main surface of said circuit board, said second line crossing said first line at an intersection area and having an electrically unconnected section at said intersection area;
   (d) a chip-type electronic component mounted on the main surface of said circuit board, said electronic component comprising:
      (i) an insulating body and
      (ii) a line disposed on said insulating body, said line electrically bridging said electrically unconnected section of said second line; and
   (e) at least one grounding terminal disposed on the main surface of said circuit board within said intersection area, said at least one grounding terminal being electrically unconnected with said first line and said second line.

4. A high-frequency circuit device, comprising:
   (a) an insulated circuit board having a main surface;
   (b) a first line disposed on the main surface of said circuit board;
   (c) a second line disposed on the main surface of said circuit board, said second line crossing said first line at an intersection area and having an electrically unconnected section at said intersection area;
   (d) a first grounding terminal disposed on the main surface of said circuit board,
   (e) a chip-type electronic component mounted on the main surface of said circuit board, said electronic component comprising:
      (i) an insulating body and
      (ii) a line disposed on said insulating body, said line electrically bridging the electrically unconnected section of said second line;
   (f) a grounding layer disposed between said line on said electronic component and said first line; and
   (g) a second grounding terminal disposed on the main surface of said circuit board within said intersection area, said second grounding terminal being electrically unconnected with said first line and said second line, and said second grounding terminal being electrically connected with said first grounding terminal.

5. A high-frequency circuit device as defined in claim 1, wherein said first line comprises a plurality of lines in said intersection area.

6. A high-frequency circuit device as defined in claim 2, wherein said first line comprises a plurality of lines in said intersection area.

7. A high-frequency circuit device as defined in claim 3, wherein said first line comprises a plurality of lines in said intersection area.

8. A high-frequency circuit device as defined in claim 4, wherein said first line comprises a plurality of lines in said intersection area.

9. A high-frequency circuit device as defined in claim 1, wherein said second line comprises a plurality of lines, each of said plurality of lines having an electrically unconnected section at said intersection area, and said electronic component comprises a line for electrically bridging each of said plurality of lines.

10. A high-frequency circuit device as defined in claim 2, wherein said second line comprises a plurality of lines, each of said plurality of lines having an electrically unconnected section at said intersection area, and said electronic component comprises a line for electrically bridging each of said plurality of lines.

11. A high-frequency circuit device as defined in claim 3, wherein said second line comprises a plurality of lines, each of said plurality of lines having an electrically unconnected section at said intersection area, and said electronic component comprises a line for electrically bridging each of said plurality of lines.

12. A high-frequency circuit device as defined in claim 4, wherein said second line comprises a plurality of lines, each of said plurality of lines having an electrically unconnected section at said intersection area, and said electronic component comprises a line for electrically bridging each of said plurality of lines.

13. A high-frequency circuit device as defined in claim 1, wherein said first line and said second line comprise a plurality of lines and said electronic component comprises a line for electrically bridging each of said plurality of lines of said second line.

14. A high-frequency circuit device as defined in claim 2, wherein said first line and said second line comprise a plurality of lines and said electronic component comprises a line for electrically bridging each of said plurality of lines of said second line.

15. A high-frequency circuit device as defined in claim 3, wherein said first line and said second line comprise a plurality of lines and said electronic component comprises a line for electrically bridging each of said plurality of lines of said second line.

16. A high-frequency circuit device as defined in claim 4, wherein said first line and said second line comprise a plurality of lines and said electronic component comprises a line for electrically bridging each of said plurality of lines of said second line.

17. A chip-type electronic component mounted on a circuit board, said circuit board comprising:

(a) an insulated circuit board having a main surface, (b) a first line disposed on the main surface of said circuit board, (c) a second line disposed on the main surface of said circuit board, said second line crossing said first line at an intersection area and having an electrically unconnected section at said intersection area, and (d) a grounding terminal disposed on the main surface of said circuit board within said intersection area, said grounding terminal being electrically unconnected with said first line and said second line;

said electronic component comprising:

(i) an insulating body, (ii) a first conductive layer disposed on said insulating body for electrically bridging the electrically unconnected section of said second line, (iii) a second conductive layer disposed in said insulating body between said first conductive layer and said first line, (iv) a pair of first terminals disposed on the side of said insulating body for electrically connecting said first conductive layer to said second line, and (v) a second terminal disposed on the side of said insulating body for electrically connecting said second conductive layer to said grounding terminal.

18. An electronic component as defined in claim 17, wherein said second conductive layer comprises a plurality of layers.

19. An electronic component as defined in claim 17, wherein said first terminals and said second terminal are disposed on an arcuate portion of said insulating body.

* * * * *